United States Patent [19]

Nakagome et al.

[11] 4,022,649

[45] May 10, 1977

[54] METHOD FOR PRODUCING METAL LAMINATES CONTAINING AN INTERLAYER OF THERMALLY STABLE HETEROCYCLIC POLYMER

[75] Inventors: Keisuke Nakagome; Toshiharu Suzuki, both of Ibaraki, Japan

[73] Assignee: Nitto Electric Industrial Co., Ltd., Ibaraki, Japan

[22] Filed: Apr. 7, 1975

[21] Appl. No.: 565,982

Related U.S. Application Data

[63] Continuation of Ser. No. 353,821, April 23, 1973, abandoned.

[30] Foreign Application Priority Data

Apr. 21, 1972  Japan ............................. 47-40689

[52] U.S. Cl. .......................... 156/309; 156/315; 156/310; 156/331; 427/379; 427/409; 427/388 R; 428/212; 428/458; 428/214; 428/474

[51] Int. Cl.² ........................................ C09J 5/06

[58] Field of Search .......... 156/331, 310, 242, 314, 156/309, 315, 324, 87, 313, 90, 322, 308; 427/388, 409, 379; 428/458, 474, 420, 212, 214, 213; 260/30.2, 33.4 P; 264/236, 347

[56] References Cited

UNITED STATES PATENTS

| | | | |
|---|---|---|---|
| 3,449,193 | 6/1969 | Bratton et al. | 156/331 |
| 3,486,934 | 12/1969 | Bond | 117/218 |
| 3,576,691 | 4/1971 | Meyers | 428/474 |
| 3,652,355 | 3/1972 | Herrick | 428/458 |

Primary Examiner—Douglas J. Drummond
Assistant Examiner—J. J. Gallagher
Attorney, Agent, or Firm—Sughrue, Rothwell, Mion, Zinn & Macpeak

[57] ABSTRACT

A metal laminate having high thermal stability is produced by forming a cured film layer of a thermally stable heterocyclic polymer such as polyamide imide having only a small volatile content on at least one surface of one or both of metal plates or foils such as aluminum, separately forming an adhesive layer of a thermally stable heterocyclic polymer having a thickness of one-third or less of the above film layer and containing a volatile matter in an amount of not more than 20% by weight, and then heat bonding both of the metal plates or foils through the above adhesive layer with the film layer being allowed to face the adhesive layer. The metal plates and foils are mutually insulated.

5 Claims, No Drawings

METHOD FOR PRODUCING METAL LAMINATES CONTAINING AN INTERLAYER OF THERMALLY STABLE HETEROCYCLIC POLYMER

This is continuation of application Ser. No. 353,821, filed Apr. 23, 1973, now abandoned.

This invention relates to a method for producing a metal laminate having high thermal resistance and consisting of mutually insulated metal plates or foils with an interlayer of a thermally stable resin film having a heterocyclic ring.

One method of producing a metal laminate having a metal plate or foil on both surfaces involves melt-bonding metal plates or foils under heat through a film of a thermoplastic polymer such as polyethylene, polypropylene, polyvinyl chloride or polyethylene terephthalate or bonding them using an adhesive. Since these polymers have low softening temperatures, it is difficult to obtain thermally stable metal laminates. Known thermally stable films include those prepared from thermally stable polymers and copolymers containing many heterocyclic rings such as polyimide, polyamide imide, polybenzimidazole, polyhydantoin, polythiazole or polyimidazopyrrolone. These polymers have superior mechanical and electrical properties at service temperatures of not more than $-40°$ C or not less than $155°$ C, and are useful as the interlayer of the metal laminate intended by this invention.

These thermally stable polymers containing heterocyclic rings are of the polycondensation type, and mostly prepared in solution. It is necessary therefore to prepare films from them by casting and drying. The cured films are not fusible nor easily soluble in solvents used for preparing these polymers. Thus, in order to bond them with metals, it is necessary to use the precursors of these polymers or uncured films of these or other adhesives. As the adhesives, epoxy resins, modified products thereof, nitrile rubber-type adhesives, acetal type adhesives, silicone resins, etc. are known. However, these adhesives have inferior thermal stability to the polymers containing heterocyclic rings, and the thermal stability of the resulting laminate only reaches the level of the thermal stability of the adhesive used.

Fluroine resins are known to be useful as adhesives having superior thermal stability, and find effective application in some fields. However, they require high melting temperatures for obtaining sufficient bond strength, and are applicable only to limited species of the polymers having heterocyclic rings, for example, to aromatic polyimides. Furthermore, when this adhesive adheres to a part of the metal plate or foil of the laminate, it causes printing or adhering difficulties to the surface of the metal plate or foil.

Polyamide-acid, a low-molecular-weight prepolymer of polyimide, or polyamide imide has been known as adhesives comprising the precursors of the polymers containing heterocyclic rings or uncured films of these polymers. The polyamide-acid and the low-molecular-weight prepolymer of polyimide undergo reaction during the bonding process to form volatile by-products. With uncured polymers such as the polyamide imide adhesive, the reducing tendency of their softening points can be utilized. However, since a great amount of solvent remains, the removal of the volatile matter is difficult in a laminate both surfaces of which are covered with metal. This inevitably results in foaming at the time of laminating or in raising or depression of the metal surfaces to impair insulating properties. Furthermore, when the metal plates or foils are bonded at low temperatures using this type of adhesive, the thermal stability of the resulting laminate is poor becuase the volatile matter remains in it. Especially when the laminate is heated abruptly, the adhesion between the metals is very likely to be destroyed.

Accordingly, it is an object of this invention to provide a method for easily producing metal laminates having superior thermal, mechanical and electrical properties, which are free from the above-mentioned defects, by using a precursor of a thermally stable polymer containing heterocyclic rings or a film of an uncured polymeric film.

According to this invention, there is provided a method for producing a metal laminate having high thermal stability and consisting of mutually insulated metal plates or foils with an interlayer of a thermally stable polymer film therebetween, which comprises a step of forming a film layer having a substantially small residual volatile content by coating a solution of a thermally stable polymer containing heterocyclic rings on at least one surface of one or both of the metal plates or foils, followed by drying, a step of forming an adhesive layer of a thermally stable polymer containing heterocyclic rings having a thickness of one-third or less of said film layer and containing a residual volatile matter in an amount of not more than 20% by weight, and a step of heat bonding both of the metal plates or foils through said adhesive layer with the film layer being placed inwardly.

First, a solution of a thermally stable polymer containing heterocyclic rings is coated on at least one surface of one or both of the metal plates or foils, and then dried by heating thereby to form a tough film. This step makes it possible to form a film firmly bonded to the surface of at least one of the metal plates or foils by dint of the properties of the polymer solution itself, and therefore, the difficult bonding step can be omitted.

Then, a solution of a polymer containing heterocyclic rings is coated on the other metal plate or foil to be laminated with said film surface or on a removable support in a thinner layer than the film layer previously formed, and dried to a lesser extent than the above drying condition but so as to remove most of the volatile matter. As a result, an adhesive film layer or an adhesive layer of a precursor of the polymer or an uncured polymer can be formed.

Finally, the metal plates or foils are bonded through the adhesive layer formed on the metal plate or foil or the adhesive film separated from the support with the film surface of the metal plate or foil being directed inwardly. This bonding is performed at a temperature higher than the temperature at which the above adhesive layer or adhesive film is dried, and a metal laminate having superior thermal stability is formed.

Examples of the thermally stable polymers containing heterocyclic rings which are useful in the present invention include polyimide, polyamide imide, polybenzimidazole, polyhydantoin, polythiazole, polyimidazopyrrolone, precursors or copolymers of these polymers. These high-molecular-weight polymers having film-formability are prepared by solution polymerization. The solvent may, for example, be N-methyl-2-pyrrolidone, dimethyl acetamide, dimethyl sulfoxide, or dimethyl formamide, but are not limited thereto. In order to obtain tough films, it is desirable that the film-forming polymers should have an inherent viscosity of at least 0.4, preferably at least 0.5. This can bring about high resistance to the bending of the resulting laminate.

Such a thermally stable polymer solution is coated uniformly on at least one surface of the metal plate or foil to be laminated, and heated to remove the solvent and to cure the polymer completely. The thickness of the resultant film is 20 to 300 microns, and the residual volatile content is substantially zero or up to 3% by weight at most. The measurement of the volatile content is made with regard to a sample obtained by drying for 2 hours at a temperature of 250° to 350° C. These heterocyclic polymers have higher water imbibition than the other polymeric materials, and when allowed to stand indoors, may absorb moisture to increase the volatile content. Care should therefore be exercised on this point.

The heterocyclic polymer which is used to form the adhesive layer or adhesive film may or may not be the same as that used for producing the film layer on the metal plate or foil. It is desirable that the adhesive layer or adhesive film should have a thickness of 2 to 20 microns after drying, which thicknesses should be one-third or less of the thickness of the above cured film layer. The drying can be performed by employing a lower temperature or a shorter period of time. The residual volatile content should be adjusted to 20% by weight or less, preferably 4 to 15% by weight. This uncured polymer with a volatile content within this range can be rendered flowable by the heat bonding process, and it is presumed that the film surface intimately adhered to the metal surface or cured is partly softened as a result of the penetration of the solvent component and can be combined with the polymer of the adhesive layer. It is assumed that the volatile component confined between the metal plates is diffused uniformly into the cured film layer, and the content of the volatile component becomes the same for the adhesive layer and the film layer. The volatile matter remaining in the adhesive layer or adhesive film is diffused uniformly into the entire film layer after laminating to lower the softening temperature or the temperature at which foaming occurs. Accordingly, the thickness of the adhesive layer and the conditions for drying it are selected so as to minimize the effect of the remaining volatile component. The volatile matter content of the entire film layer in a metal laminate having good thermal stability is not more than 5% by weight, preferably not more than 3% by weight.

The metal plate or foil may be made of a metal such as iron, aluminum, copper, zinc, nickel or silver or an alloy such as stainless steel, brass, or cupro-nickel, and may be chemically treated at the surface, for example, by plating, surface roughening or oxidation treatment. In order to obtain especially high bond strength, it is effective to subject the surface of the metal plate or foil to an electrochemical surface roughening or oxidation treatment.

The following Examples are given to illustrate the present invention.

EXAMPLE 1

A polyamide imide solution (A) (the viscosity of the solution 1,100 poises, inherent viscosity 0.85) prepared from 0.7 mol of trimellitic anhydride, 0.3 mol of isophthalic acid, 1.05 mols of diphenylmethane diisocyanate and N-methyl-2-pyrrolidone as a solvent was coated on a 1 mm thick aluminum plate in a thickness of 250 microns, and dried for 30 minutes at 100° C, 180° C, and 260° C, respectively to form a pre-laminate (B) having a residual volatile content of 0.8% by weight with a film layer firmly adhered to the aluminum plate in a thickness of 50 microns.

The polyamide imide solution (A) was coated on a 50 micron thick aluminum foil in a thickness of 50 microns, and dried for 20 minutes at 230° C to form a pre-laminate (C) with a firmly adhered adhesive layer in a thickness of about 10 microns. This adhesive layer had a volatile content of 5% by weight.

The film surface of the pre-laminate (B) was superposed on the adhesive layer of the pre-laminate (C), and they were maintained under uniform pressure for 30 minutes at 270° C. After cooling, a laminate having mutually insulated aluminum plates of good flatness on both surfaces was obtained.

When this laminate was abruptly heated at 280° C, no change was observed on the bonding interface. When it was heated at 300° C, slight blister was formed on the aluminum foil surface. This is not so much different from the critical temperature (300° C) of foaming in the abrupt heating of the pre-laminate (B).

The peel strength between the aluminum foil and the film was 2.0 Kg/cm width, and the breakdown voltage between the aluminum plate and the foil was 10.3 KV. After the above abrupt heating at 280° C, no reduction was observed both in peel strength and breakdown voltage.

The aluminum foil surface was chemically corroded to form an electric circuit, and this laminate was used as a panel heater. Even when such an etched circuit was allowed to stand for 1 hour in boiling water, no change was observed, and there was no change in the peel strength of the aluminum foil.

COMPARATIVE EXAMPLE 1

The polyamide imide solution (A) of Example 1 was coated on a 1 mm thick aluminum plate so as to form an adhesive layer with a thickness of 100 microns, and dried at 200° C to form a film with a residual volatile content of 8% by weight. The aluminum plate was superposed on a 50 micron thick aluminum foil, and they were heat bonded under the same conditions as in Example 1. After cooling, raised and depressed portions were observed on the aluminum foil surface, and it was impossible to obtain a laminate of good quality. When they were bonded at 220° C, a firmly bonded laminate was obtained. When this laminate was abruptly heated at 250° C, marked rises and depressions were observed on the aluminum foil surface.

EXAMPLE 2

The polyamide imide solution (A) used in Example 1 was coated uniformly on a 35 micron thick rolled copper foil whose surface had been oxidized, in a thickness of 300 microns. It was finally dried at 260° C for 35 minutes to form a pre-laminate (D) with a firmly bonded film having a volatile content of 0.9% by weight. Then, a polyimide solution (E) obtained by reacting 1 mol of 1,2,3,4-butanetetracarboxylic acid with 1 mol of diaminodiphenyl methane in m-cresol was coated on a 2 mm thick copper plate in a thickness of 40 microns, and finally dried at 200° C to form a pre-laminate (F) having an adhesive layer with a volatile content of 12% by weight. The film surface of the pre-laminate (D) was superposed on the adhesive layer of the pre-laminate (F). They were pre-bonded at 0.75 Kg/cm$^2$ and 250° C, and subsequently bonded at 25 Kg/cm$^2$, followed by cooling to form a laminate of good quality. The copper foil had a peel strength of 1.55 Kg/cm width, and a breakdown voltage of 9.8 KV. When the laminate was heated abruptly at 280° C, no change was observed.

When the copper foil surface was etched to form an electrical circuit, the laminate could be used as a solderable tough circuit plate with good heat dissipation. A pasty resistor could be printed on the film surface which was revealed by etching the copper foil.

EXAMPLE 3

The same polyamide imide solution (A) as used in Example 1 was coated on a Teflon (polytetrafluoroethylene) sheet and dried to form an adhesive film (G) having a thickness of 12 microns and a volatile content of 10% by weight. This adhesive film was interposed between the film surfaces of two pre-laminates (D) as used in Example 2. They were bonded preliminarily at 250° C and then at 10 Kg/cm$^2$ for 20 minutes, followed by cooling.

When the resulting laminate was abruptly heated at 280° C, no change occurred on the copper foil surface. When the laminate was cooled to −75° C and then heated to 200° C and this cooling-heating cycle was repeated 100 times, no change was observed. The peel strength of the copper foil was 1.6 Kg/cm width on both surfaces, and it was difficult to peel it off from the bonding surfaces. Also, it had a breakdown voltage of 11.7 KV.

This laminate is usable as a flexible printing base plate.

EXAMPLE 4

A polyamide imide/hydantoin copolymer solution (H) (inherent viscosity 0.8) was prepared by reacting 0.12 mol of trimellitic anhydride, 0.2 mol of diphenylmethane diisocyanate and 0.08 mol of N,N'-biscarboethoxymethyl-4,4'-diaminodiphenylmethane in m-cresol. This solution was coated on both surfaces of a 2 mm thick iron plate, and finally dried at 250° C to form a pre-laminate (I) with a volatile content of 0.5% by weight.

The film surfaces of the pre-laminate (I) were superposed on the adhesive layers of the pre-laminate (F) as used in Example 2, and they were bonded at 250° C and 10 Kg/cm$^2$ for 20 minutes, followed by cooling. There was obtained a firmly bonded laminate. When this laminate was abruptly heated at 280° C, no change was observed on the bonding surfaces.

EXAMPLE 5

Two adhesive films (G) as used in Example 3 were superposed on both surfaces of the pre-laminate (I) used in Example 4, and further on both surfaces, 70 micron thick surface-roughened electrolytic copper foils were superposed. They were bonded at 260° C and 20 Kg/cm$^2$ for 30 minutes, and cooled under pressure. There was obtained a laminate consisting of three mutually insulated layers of good surface characteristics which were bonded to each other firmly.

When this laminate was heated abruptly at 280° C, no change was observed.

COMPARATIVE EXAMPLE 2

Electrolytic copper foils each with a thickness of 35 microns were superposed on both surfaces of a 50 micron thick polyamide imide film (Paifron Film, product of Hitach Chemical Co. Ltd.) through the same adhesive film (G) as used in Example 3. They were pre-bonded at 250° C, and then further bonded at 10 Kg/cm$^2$ for 20 minutes, followed by cooling. Slight rises and depressions were observed on the copper foil surfaces of the laminate. When the laminate was heated abruptly at 280° C, marked rises and depressions were formed on the copper foil surfaces.

COMPARATIVE EXAMPLE 3

One mol of 1,2,3,4-butanetetracarboxylic dianhydride was reacted under cooling with 1 mol of diaminodiphenyl ether in dimethyl acetamide. The resulting polyamide-acid solution was coated on a 1 mm thick aluminum plate and dried at 60° C at reduced pressure to form a film having a volatile content of 16% by weight and a thickness of 15 microns. A 35 micron thick electrolytical copper foil was superposed thereon, and they were bonded for 10 minutes at 300° C and 1 Kg/cm$^2$, followed by cooling. Blister was partly observed on the copper foil surface of the resulting laminate, but at other parts, the copper foil was firmly adhered to the film. When the laminate was heated abruptly at 260° C, marked rises and depressions were observed on the copper foil.

EXAMPLE 6

A solution of a polyhydantoin (Resistherm PH-20, product of Bayer AG) in m-cresol was coated on the same pre-laminate (B) as used in Example 1 in a thickness of 30 microns, and dried at 200° C to form an uncured layer with an adhesive layer having a residual solvent content of 3% by weight. A 35 micron thick electrolytic copper foil was superposed on the uncured layer, and they were bonded at 250° C to form a laminate of good quality. The peel strength of the copper foil was 1.3 Kg/cm width. When the laminate was heated abruptly at 260° C, no change was observed on the bonding surface.

As described above, the thermal stability, cold resistance, adhesiveness, mechanical strength and electrical insulation of the polymers having heterocyclic rings are effectively utilized in the present invention to form a multilayered metal laminate consisting of mutually insulated metal plate or foils. When the polymer having heterocyclic rings has a volatile matter ascribable to its reactive portion or the solvent, it tends to lower the softening temperature of the polymer. Thus, when it is used itself as an adhesive layer in preparing a laminate, it is difficult to increase the thermal stability of the polymer after releasing the volatile matter, because the adhesive layer is a closed system. According to the present invention, a precured film layer is formed on the surface of metal to minimize the amount of the adhesive layer required, and by heat bonding metals through the adhesive layer, the volatile matter in the adhesive layer is diffused into the cured film layer so that the volatile matter will hardly affect the thermal stability of the film. Accordingly, the laminates obtained in accordance with this invention have strong resistance to various temperature shock.

Since the interlayer of the film does not contain a different kind of adhesive, there is no reduction in breakdown voltage as is often seen in laminating insulating materials of different dielectric constants.

While the invention has been described in detail and with reference to specific embodiments thereof, it will be apparent to one skilled in the art that various changes and modifications can be made therein without departing from the spirit and scope thereof.

What is claimed is:

1. A method for producing a metal laminate having high thermal stability and consisting of mutually insulated metal plates or foils with an interlayer of thermally stable polymer film comprising the steps of:
   A. forming at least one film layer having a substantially small volatile content of at most 3% by weight on a surface of one or both of the metal plates or foils, by coating and drying a solution of a thermally stable polymer containing heterocyclic rings on said surface or surfaces;
   B. forming at least one adhesive layer on a non-coated surface of one of the metal plates or foils and/or on said at least one film layer, said adhesive layer having a thickness of one-third or less of said film layer and containing a volatile content in an amount of 4 to 20% by weight, by coating and drying a solution of a thermally stable polymer containing heterocyclic rings on said non-coated surface or surfaces and/or said film layer or layers;
   C. heat-bonding both of the metal plates or foils through at least a film layer and an adhesive layer so that the volatile content uniformly diffuses throughout the bonding interlayer and is confined therein, which is formed of said at least one film layer and said at least one adhesive layer, and is less than 5% by weight.

2. The method of claim 1 wherein said thermally stable polymer has an inherent viscosity of at least 0.4.

3. The method of claim 1 wherein said adhesive layer has a thickness of 2 to 20 microns.

4. The method of claim 1 wherein said adhesive layer has a volatile content of 4 to 15% by weight.

5. The method of claim 1 wherein said heterocyclic polymer is polyimide, polyamide imide, polybenzimidazole, polyhydantoin, polythiazole, polyimidazopyrrolone, or a percursor or copolymer of any of these polymers.

* * * * *